(12) United States Patent
Escobar-Bowser

(10) Patent No.: US 6,362,686 B1
(45) Date of Patent: Mar. 26, 2002

(54) FAST SATURATION RECOVERY OPERATIONAL AMPLIFIER INPUT STAGE

(75) Inventor: Priscilla Escobar-Bowser, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/669,053

(22) Filed: Sep. 25, 2000

Related U.S. Application Data

(60) Provisional application No. 60/157,648, filed on Oct. 4, 1999.

(51) Int. Cl.[7] .................................................. H03F 3/45
(52) U.S. Cl. ........................ 330/252; 330/255; 330/257
(58) Field of Search ................................ 330/252, 255, 330/257, 267

(56) References Cited

U.S. PATENT DOCUMENTS

| | | | | |
|---|---|---|---|---|
| 4,853,645 A | * | 8/1989 | Seevinck et al. | 330/255 |
| 4,857,861 A | * | 8/1989 | Seevinck et al. | 330/255 |
| 5,640,120 A | * | 6/1997 | Wiest et al. | 330/267 |
| 5,699,015 A | * | 12/1997 | Dotson et al. | 330/255 |
| 5,742,248 A | * | 4/1998 | Vorenkamp et al. | 330/252 |

OTHER PUBLICATIONS

David Jones, "Analog Integrated Circuit Design" (1997), pp. 266–268.

* cited by examiner

*Primary Examiner*—Michael B Shingleton
(74) *Attorney, Agent, or Firm*—Mark Courtney; W. James Brady; Frederick J. Telecky, Jr.

(57) ABSTRACT

An operational amplifier input stage includes a first differential input transistor and a second differential input transistor receiving a differential input voltage. A first translinear loop is coupled to the first differential input transistor and a second translinear loop is coupled to the second differential input transistor. The first and second translinear loops are operable to supply an instantaneous current to the respective first and second differential input transistors to sufficiently charge capacitances therein during slewing conditions.

18 Claims, 1 Drawing Sheet

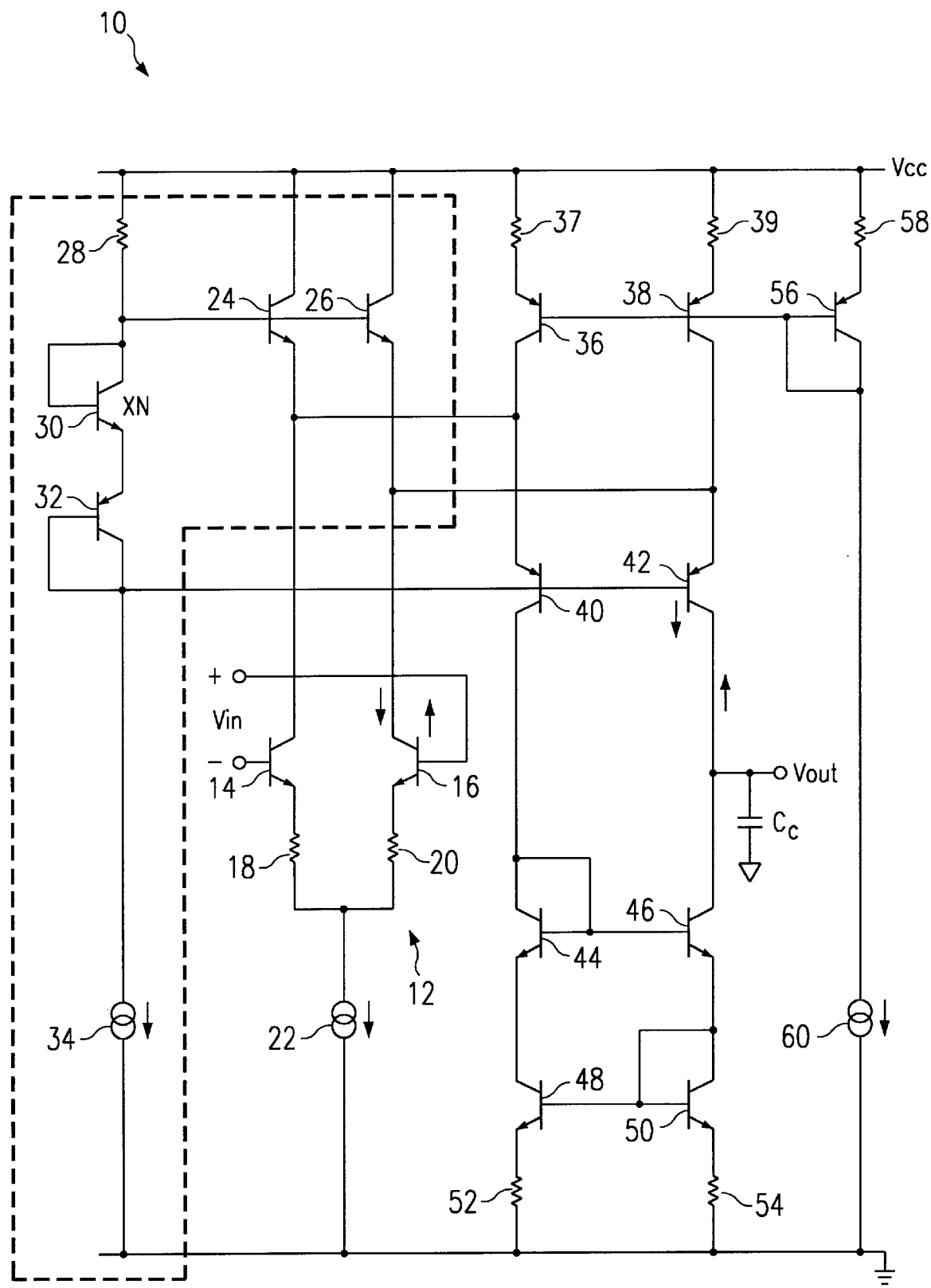

FAST SATURATION RECOVERY OPERATIONAL AMPLIFIER INPUT STAGE

This application claims priority under 35 USC §119(e)(1) of provisional application No. 60/157,648 filed Oct. 4, 1999.

TECHNICAL FIELD OF THE INVENTION

This invention is related in general to the field of electrical and electronic circuits. More particularly, the invention is related to a fast saturation recovery operational amplifier input stage.

BACKGROUND OF THE INVENTION

The advancement of communication technology is pushing higher demands for faster and better behaved circuits. For operational amplifiers, the demand is for larger bandwidths and faster slew rates. As circuit speed increases, circuit design becomes even more challenging. With faster circuit speeds, parasitic capacitances become a critical component in determining the transient and frequency response of the circuit.

Traditionally, operational amplifier differential input pairs undergo saturation during fast slewing conditions. One side of the differential pair turns off while the other side slews at full power. The faster the edge speed of the input signal and the higher the bandwidth of the operational amplifier, the deeper into saturation the operational amplifier input transistor sinks. Once the operational amplifier input transistor is done with slewing, it is difficult to transition from saturation to the high gain region and settling to within the operational amplifier open loop accuracy. Therefore, the deep saturation of the input transistor increases the transient time for the operational amplifier to go into the high gain region. The problem shows up as a poor settling behavior after the rising and/or falling edges of high speed input signals.

Traditionally, this problem is mitigated by providing significantly larger amounts of quiescent current through the operational amplifier when compared with the total current needed during the slewing conditions. This solution is disadvantageous because it requires much higher power consumption. Other approaches have added slew compensation networks that are too complex and therefore is inadequate for high speed applications. Yet other approaches use simplistic slew compensation networks that provide uncontrolled amounts of current that are either insufficient or excessive. Still other approaches, such as one described in chapter 6 of Johns, D., *Analog Integrated Circuit Design*, published by John Wiley & Sons, Inc. 1997, where the added measures are not sufficient or too slow to react when the input has a high frequency waveform in high speed communications applications.

SUMMARY OF THE INVENTION

Accordingly, there is a need for an input stage of the operational amplifier to be saturation-free during slewing conditions and to be able to respond quickly to high speed differential input waveforms.

In accordance with the present invention, an anti-saturation operational input stage is provided which eliminates or substantially reduces the disadvantages associated with prior circuits.

In one aspect of the invention, an operational amplifier input stage includes a differential input pair receiving a differential input voltage, and a translinear loop circuit coupled to the differential input pair operable to supply an instantaneous current to the differential input pair sufficient to charge capacitances in the differential input pair during slewing conditions.

In another aspect of the invention, an operational amplifier input stage includes a first differential input transistor and a second differential input transistor receiving a differential input voltage. A first translinear loop is coupled to the first differential input transistor and a second translinear loop is coupled to the second differential input transistor. The first and second translinear loops are operable to supply an instantaneous current to the respective first and second differential input transistors to sufficiently charge capacitances therein during slewing conditions.

In yet another aspect of the invention, an operational amplifier having a folded cascode input stage includes a first differential input transistor and a second differential input transistor receiving a differential input voltage, a first translinear loop coupled to the first differential input transistor and a second translinear loop coupled to the second differential input transistor, the first and second translinear loops operable to supply an instantaneous current to the respective first and second differential input transistors to sufficiently charge capacitances therein during slewing conditions. Each of the translinear loop includes a first current source transistor with its emitter coupled to the collector of the first differential input transistor and its collector coupled to an active load circuit, a second current source transistor with its emitter coupled to the emitter of the first current source transistor and the collector of the first differential input transistor and operable to supply current to the first differential input transistor to prevent the first differential input transistor from going into saturation during slewing conditions, and to supply current to the first current source transistor to prevent the first current source transistor from turning off during slewing conditions, a first biasing circuit coupled to the second current source transistor operable to supply a first fixed bias voltage therefor, and a second biasing circuit coupled to the first current source transistor operable to supply a second fixed bias voltage therefor, the second fixed bias voltage having a fixed relationship with the first fixed bias voltage.

BRIEF DESCRIPTION OF THE DRAWINGS

For a better understanding of the present invention, reference may be made to the accompanying drawings, in which:

The FIGURE is a circuit schematic diagram of fast saturation recovery operational amplifier input stage constructed according to an embodiment of the present invention.

DETAILED DESCRIPTION OF THE INVENTION

Referring to the FIGURE, a fast saturation recovery operational amplifier input stage circuit 10 constructed according to the teachings of the present invention is shown. Circuit 10 includes a differential input pair 12, which includes transistors 14 and 16 coupled to an input voltage, $V_{IN}$. The emitters of transistors 14 and 16 are coupled to ground via resistors 18 and 20, respectively, and a current source 22. The collectors of transistors 14 and 16 are coupled to a supply voltage, $V_{CC}$, via transistors 36 and 38 and resistors 37 and 39, respectively. The base terminals of transistors 36 and 38 are coupled together. Transistors 36 and 38 function as current sources. The collectors of transistors 36 and 38 are respectively coupled to the emitters of transistors 40 and 42 and to a current mirror circuit which also acts as the active load. The current mirror circuit includes transistors 44–50 and resistors 52 and 54. The base terminals of transistors 44 and 46 are coupled together and the base terminals of transistors 48 and 50 are coupled together. Transistors 44 and 50 are connected as diodes. The base terminals of transistors 36 and 38 are coupled to the base and collector of a third transistor 56, which is diode-connected. A resistor 58 is coupled between the emitter of transistor 56 and $V_{CC}$. A current source 60 is coupled between the collector of transistor 56 and ground. The output of input stage 10, $V_{OUT}$, is a node between transistors 42 and 46. A capacitor, $C_C$, is coupled between $V_{out}$ and ground.

Coupled to the folded cascode circuit of the input stage is a fast saturation recovery circuit which includes transistors 24 and 26 coupled to the collectors of transistors 14 and 16, respectively, and the supply voltage, $V_{CC}$. The base terminals of transistors 24 and 26 are both coupled to the $V_{CC}$ through a resistor 28 and to a diode-connected transistor 30. Diode-connected transistor 30 is coupled to the emitter of a diode-connected transistor 32, the collector of which is coupled to ground through a current source 34. The base of transistor 32 is coupled to the base terminals of transistors 40 and 42.

Note that transistors 14 and 16 are shown as npn-type bipolar junction transistors, and cascode transistors 40 and 42 are pnp-type bipolar junction transistors. This is typical of the folded cascode operational amplifier architecture. This arrangement of opposite-type transistors allows the output of the single gain-stage amplifier to be taken at the same bias voltage levels as the input signals. Further, the transistor type and technology of all the transistors in the circuit may be modified using complementary bipolar transistor technology.

In operation, assume that $V_{IN}$ is a high frequency square input signal applied to the non-inverting input at the base of transistor 16 and the circuit has been configured as a voltage follower with the output node coupled to the input node at the base of transistor 14 and that circuit 10 has been operating and has stabilized. The base of transistor 16, the non-inverting input, receives the rising input signal edge while the inverting input at the base of transistor 14 is still in the previous falling edge transition. As a result, transistors 14 and 16 are out of balance and the current that is supposed to be evenly split between them now flows only through transistor 16. The faster the input signal and the faster the slew rate of the amplifier, the harder the collector of transistor 16 falls in attempting to charge the parasitic capacitances to sustain the slewing transition. That instantaneous current comes from transistor 38, assuming for now that transistor 26 is not part of the circuit. Therefore, the quiescent current through transistor 38 must be sufficiently large to supply transistor 16 to charge the capacitances. As the collector voltage of transistor 16 drops sharply, the base-emitter junction voltage of transistor 42 also decreases sharply. Transistor 42 is thus in the cut-off region. Once amplifier finishes slewing and is ready to settle to open loop gain, transistors 14 and 42 has difficulty turning on while transistor 16 has difficulty coming out of the deep saturation, saturation or quasi-saturation region and enters the active region. This poor settling behavior is exhibits itself as a long dip or saturation behavior right after the transition. The same poor settling behavior also occurs on the negative slewing edges.

Now, with the fast saturation recovery circuit, diode 30, which may be implemented as a transistor of the same type as transistors 24 and 26 with an N number of emitters, and transistor 32 provide a bias voltage to the base terminals of transistors 40 and 42. Diode-connected transistor 30 also biases transistors 24 and 26 quiescently. When the rising edge slewing transition occurs when transistor 16 receives a fast rising edge, its collector voltage drops quickly. Because the base of transistor 26 is biased at a fixed voltage ($V_{CC}$ minus the voltage drop across resistor 28), when the collector of transistor 26 pulls down the emitter of transistor 42, it also pulls down the emitter of transistor 26 by the same amount. Therefore, the current needed by transistor 16 is sensed by transistors 26 and 42 through a translinear loop formed by transistors 30, 32, 26 and 42. The base-emitter voltage of transistor 26 in series with the base-emitter voltage of transistor 42 is tied to a first reference voltage at the base-emitter of transistor 30 and the second reference voltage at the base-emitter of transistor 32. A current proportional to the needs of transistor 16 is provided via transistor 26. Therefore, transistor 26 provides a current proportional to the instantaneous needs of transistor 16, thus preventing transistor 42 from turning off hard and transistor 16 from going deep into saturation.

The same operation applies to the inverting input at the base of transistor 14, which is aided by a second translinear loop formed by transistors 24, 40, 30 and 32. Similarly, the current through transistor 24 is sufficient to keep transistor 40 from turning off hard and transistor 14 from going deep into saturation.

Note that anti-saturation transistors 24 and 26 are nearly off quiescently as biased by diode-connected transistor 30. Transistors 32 and 40 and 42 act like current mirrors—the current flowing through the branch formed by resistor 28 and 30 and transistors 30 and 32, are mirrored in the branches formed by resistor 37, transistors 36 and 40 and by resistor 39 and transistors 38 and 42. However, transistors 24 and 26 can quickly swing into action when they detect that transistor 40 or 42 is on the verge of turning off during slewing. For very high speed applications, a very small current may be quiescently trickled through transistors 24 and 26 so that their respond time may be further improved.

Constructed and operating in this manner, the operation amplifier input stage of the present invention provides an extremely fast, precise and well-controlled dynamic slew current compensation to the differential input pair when needed. Although the current invention is shown implemented with a folded cascode architecture because of its suitability to high speed applications due to its single high impedance node at the output, the present invention is applicable to other operational amplifier circuits with differential input pairs.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. An operational amplifier input stage comprising:
   a differential input pair receiving a differential input voltage; and
   a translinear loop circuit coupled to the differential input pair operable to supply an instantaneous current to the differential input pair sufficient to charge capacitances in the differential input pair during slewing conditions.

2. The operational amplifier input stage, as set forth in claim 1, wherein the differential input pair comprises a first input transistor and a second input transistor, the base terminals of the first and second transistors receiving the differential input voltage, and the translinear loop circuit comprises a first translinear loop coupled to the first input transistor and a second translinear loop coupled to the second input transistor, the first and second translinear loops operable to supply an instantaneous current to the respective first and second input transistors to charge the base and collector capacitances during slewing conditions.

3. The operational amplifier input stage, as set forth in claim 2, wherein the first translinear loop comprises:
   a first current source transistor with its emitter coupled to the collector of the first input transistor and its collector coupled to an active load circuit of the operational amplifier input stage;
   a second current source transistor with its emitter coupled to the emitter of the first current source transistor and the collector of the first input transistor and operable to supply current to the first input transistor to prevent the first input transistor from going into saturation during slewing conditions, and to supply current to the first current source transistor to prevent the first current source transistor from turning off during slewing conditions;
   a first biasing circuit coupled to the second current source transistor operable to supply a first fixed bias voltage therefor; and
   a second biasing circuit coupled to the first current source transistor operable to supply a second fixed bias voltage therefor, the second fixed bias voltage having a fixed relationship with the first fixed bias voltage.

4. The operational amplifier input stage, as set forth in claim 3, wherein the second biasing circuit comprises:
   a first resistor coupled to the supply voltage;
   a first diode-connected transistor coupled in series with the first resistor;
   a second diode-connected transistor coupled in series with the first diode-connected transistor;
   a current source coupled in series with the diode-connected transistor and to ground; and
   the base of the first current source transistor being coupled to the base of the diode-connected transistor, and the base of the second current source transistor being coupled to the supply voltage through the first resistor.

5. The operational amplifier input stage, as set forth in claim 4, wherein the first biasing circuit comprises a second resistor coupled between the supply voltage and the emitter of a third current source transistor, the collector of which is coupled to the emitter of the first current source transistor.

6. The operational amplifier input stage, as set forth in claim 2, wherein the second translinear loop comprises:
   a fourth current source transistor with its emitter coupled to the collector of the second input transistor and its collector coupled to an active load circuit of the operational amplifier input stage;
   a fifth current source transistor with its emitter coupled to the emitter of the fourth current source transistor and the collector of the second input transistor and operable to supply current to the second input transistor to prevent the second input transistor from going into saturation during slewing conditions, and to supply current to the fourth current source transistor to prevent the fourth current source transistor from turning off during slewing conditions;
   a first biasing circuit coupled to the fifth current source transistor operable to supply a first fixed bias voltage therefor; and
   a third biasing circuit coupled to the fourth current source transistor operable to supply a third fixed bias voltage therefor, the third fixed bias voltage having a fixed relationship with the first fixed bias voltage.

7. The operational amplifier input stage, as set forth in claim 6, wherein the base of the fourth current source transistor being coupled to the base of the diode-connected transistor, and the base of the fifth current source transistor being coupled to the supply voltage through the first resistor.

8. The operational amplifier input stage, as set forth in claim 6, wherein the first biasing circuit comprises a third resistor coupled between the supply voltage and the emitter of a sixth current source transistor, the collector of which is coupled to the emitter of the fourth current source transistor.

9. An operational amplifier comprising:
   a first differential input transistor and a second differential input transistor receiving a differential input voltage; and
   a first translinear loop coupled to the first differential input transistor and a second translinear loop coupled to the second differential input transistor, the first and second translinear loops operable to supply an instantaneous current to the respective first and second differential input transistors to sufficiently charge capacitances therein during slewing conditions.

10. The operational amplifier, as set forth in claim 9, wherein the first translinear loop comprises:
    a first current source transistor with its emitter coupled to the collector of the first differential input transistor and its collector coupled to an active load circuit;
    a second current source transistor with its emitter coupled to the emitter of the first current source transistor and the collector of the first differential input transistor and operable to supply current to the first differential input transistor to prevent the first differential input transistor from going into saturation during slewing conditions, and to supply current to the first current source transistor to prevent the first current source transistor from turning off during slewing conditions;
    a first biasing circuit coupled to the second current source transistor operable to supply a first fixed bias voltage therefor; and
    a second biasing circuit coupled to the first current source transistor operable to supply a second fixed bias voltage therefor, the second fixed bias voltage having a fixed relationship with the first fixed bias voltage.

11. The operational amplifier, as set forth in claim 10, wherein the second biasing circuit comprises:
    a first resistor coupled to the supply voltage;
    a first diode-connected transistor coupled in series with the first resistor;
    a second diode-connected transistor coupled in series with the first diode-connected transistor;
    a current source coupled in series with the diode-connected transistor and to ground; and
    the base of the first current source transistor being coupled to the base of the diode-connected transistor, and the base of the second current source transistor being coupled to the supply voltage through the first resistor.

12. The operational amplifier, as set forth in claim 11, wherein the first biasing circuit comprises a second resistor coupled between the supply voltage and the emitter of a third current source transistor, the collector of which is coupled to the emitter of the first current source transistor.

13. The operational amplifier, as set forth in claim 10, wherein the second translinear loop comprises:
   a fourth current source transistor with its emitter coupled to the collector of the second differential input transistor and its collector coupled to the active load circuit;
   a fifth current source transistor with its emitter coupled to the emitter of the fourth current source transistor and the collector of the second differential input transistor and operable to supply current to the second differential input transistor to prevent the second input transistor from going into saturation during slewing conditions, and to supply current to the fourth current source transistor to prevent the fourth current source transistor from turning off during slewing conditions;
   a first biasing circuit coupled to the fifth current source transistor operable to supply a first fixed bias voltage therefor; and
   a third biasing circuit coupled to the fourth current source transistor operable to supply a third fixed bias voltage therefor, the third fixed bias voltage having a fixed relationship with the first fixed bias voltage.

14. The operational amplifier, as set forth in claim 13, wherein the base of the fourth current source transistor being coupled to the base of the diode-connected transistor, and the base of the fifth current source transistor being coupled to the supply voltage through the first resistor.

15. The operational amplifier, as set forth in claim 14, wherein the first biasing circuit comprises a third resistor coupled between the supply voltage and the emitter of a sixth current source transistor, the collector of which is coupled to the emitter of the fourth current source transistor.

16. An operational amplifier having a folded cascode input stage, comprising:
   a first differential input transistor and a second differential input transistor receiving a differential input voltage;
   a first translinear loop coupled to the first differential input transistor and a second translinear loop coupled to the second differential input transistor, the first and second translinear loops operable to supply an instantaneous current to the respective first and second differential input transistors to sufficiently charge capacitances therein during slewing conditions;
   each of the translinear loop comprising:
      a first current source transistor with its emitter coupled to the collector of the first differential input transistor and its collector coupled to an active load circuit;
      a second current source transistor with its emitter coupled to the emitter of the first current source transistor and the collector of the first differential input transistor and operable to supply current to the first differential input transistor to prevent the first differential input transistor from going into saturation during slewing conditions, and to supply current to the first current source transistor to prevent the first current source transistor from turning off during slewing conditions;
      a first biasing circuit coupled to the second current source transistor operable to supply a first fixed bias voltage therefor; and
      a second biasing circuit coupled to the first current source transistor operable to supply a second fixed bias voltage therefor, the second fixed bias voltage having a fixed relationship with the first fixed bias voltage.

17. The operational amplifier, as set forth in claim 16, wherein the second biasing circuit comprises:
   a first resistor coupled to the supply voltage;
   a first diode-connected transistor coupled in series with the first resistor;
   a second diode-connected transistor coupled in series with the first diode-connected transistor;
   a current source coupled in series with the diode-connected transistor and to ground; and
   the base of the first current source transistor being coupled to the base of the diode-connected transistor, and the base of the second current source transistor being coupled to the supply voltage through the first resistor.

18. The operational amplifier, as set forth in claim 16, wherein the first biasing circuit comprises a second resistor coupled between the supply voltage and the emitter of a third current source transistor, the collector of which is coupled to the emitter of the first current source transistor.

* * * * *